United States Patent
De Cremoux et al.

(10) Patent No.: US 7,230,485 B2
(45) Date of Patent: Jun. 12, 2007

(54) THREE STATE CLASS D AMPLIFIER

(75) Inventors: Guillaume De Cremoux, Nijmegen (FR); Insun Van Loo, Nijmegen (NL)

(73) Assignee: NXP B.V., Eindhoven (NL)

( * ) Notice: Subject to any disclaimer, the term of this patent is extended or adjusted under 35 U.S.C. 154(b) by 129 days.

(21) Appl. No.: 10/548,247

(22) PCT Filed: Mar. 2, 2004

(86) PCT No.: PCT/IB2004/050188

§ 371 (c)(1),
(2), (4) Date: Sep. 6, 2005

(87) PCT Pub. No.: WO2004/082133

PCT Pub. Date: Sep. 23, 2004

(65) Prior Publication Data

US 2006/0077007 A1    Apr. 13, 2006

(30) Foreign Application Priority Data

Mar. 10, 2003  (EP) .................................. 03100595

(51) Int. Cl.
*H03F 3/217* (2006.01)
(52) U.S. Cl. ..................... 330/251; 330/207 A; 330/10
(58) Field of Classification Search ................ 330/251, 330/207 A, 10
See application file for complete search history.

(56) References Cited

U.S. PATENT DOCUMENTS

| | | | | |
|---|---|---|---|---|
| 5,194,821 A | * | 3/1993 | Brambilla et al. ............. 330/51 |
| 5,617,058 A | * | 4/1997 | Adrian et al. .................. 330/10 |
| 5,949,282 A | | 9/1999 | Nguyen et al. |
| 6,005,316 A | * | 12/1999 | Harris ......................... 310/90.5 |
| 6,211,728 B1 | | 4/2001 | Chen et al. |
| 6,229,389 B1 | * | 5/2001 | Pullen et al. .................. 330/10 |
| 6,262,632 B1 | | 7/2001 | Corsi et al. |
| 6,320,460 B1 | | 11/2001 | Meszlenyi |
| 6,346,852 B1 | | 2/2002 | Masini et al. |
| 6,552,607 B1 | * | 4/2003 | Danielson ..................... 330/10 |
| 2004/0047477 A1 | * | 3/2004 | Bank et al. ................. 381/120 |

* cited by examiner

*Primary Examiner*—Patricia Nguyen

(57) ABSTRACT

A three state class D amplifier (100) comprising a first signal path (1) and a second signal path (1') substantially identical with the first signal path (1). Each of the signal paths (1, 1') comprises respective first and second low-pass filter means (10, 10') coupled to respective input signals ($V_n$, $V_p$) provided by input means (Inp, In, Ip), first and second ends (A, B) of a load (5) and to an pulse generator (2) providing a signal having a frequency substantially higher than a frequency of the input signals ($V_n$, $V_p$) for generating respective first and second low-pass filtered signals (SUP, SDW). The low-pass filtered signals (SUP, SDW) are inputted to respective comparing means (3, 3'). The comparing means (3, 3') are coupled to a threshold generator (4) coupled to the input means (Inp, In, Ip) and to first and second reference signals ($V_{max}$, $V_{min}$) representing an estimation of a maximum and a minimum signal value through the load (5) and generating an alternating threshold signal (THRES) that is inverse proportional to a difference between the first and second input signals ($V_n$, $V_p$) for maintaining a relative high gain of the amplifier in an idle state.

14 Claims, 5 Drawing Sheets

THREE STATE CLASS D AMPLIFIER

The invention relates to a three state class D amplifier comprising
a first signal path and a second signal path substantially identical with the first signal path,
each of the signal paths comprising a respective first and second low
pass filter means coupled to respective input signals generated by a common input signal, first and second ends of a load and to a pulse generator providing a signal having a frequency substantially higher than a frequency of the input signals for generating respective first and second low-pass filtered signals, said low-pass filtered signals being inputted to respective subtracting means.

Class D amplifiers are relatively widely used in audio applications because their efficiency may be practically at least 90% comparing with 25% of the state of the art class AB amplifiers. A class D amplifier is based on the same principle as DC-DC switchers as shown in FIG. 11. A Pulse Width Modulation (PWM) at a high frequency of an input signal In is achieved by means of a comparison using a comparator C of the input signal In with a high frequency saw-tooth shaped signal Vchop. The saw-tooth signal Vchop may have a frequency of 500 kHz and the input signal In may be in audio domain i.e. less than 20 kHz. At the output of the comparator C, a PWM signal whose duty-cycle depends on the magnitude of the input signal In, is obtained. The PWM signal drives two power low-ohmic switches SW1, SW2 to reproduce the same output PWM signal, but with a high power capability. A L,C filter is used for low-pass filtering the 500 kHz frequency modulation for reproducing the initial signal shape of the input signal In with a high power capability. The output power may be in a range e.g. from 1 W to 80 W. The efficiency of class D amplifiers is substantially higher than that of linear amplifiers e.g. 90%, compared to 25% for the state-of-the-art class AB amplifiers in audio applications.

Nevertheless, for the class D amplifiers shown in FIG. 11 the output power of the output PWM signal depends on the magnitude of the power supply Vpp such that if Vpp is not well known, there is no indication on the final resulting magnitude of the PWM signal. Hence, feedback techniques are commonly used in class D and are presented in FIG. 12. In FIG. 12 it is easy to recognize the class D amplifier presented in FIG. 11, the circuit further comprising an error amplifier EA coupled to the comparator C. Furthermore, the input signal is inputted to a first input of the error amplifier EA. A feedback signal OUTP is provided to a second input of the error amplifier EA. It is observed that the error amplifier makes a difference between the input signal and the feedback signal OUTP and amplifies the resulted difference. The error amplifier EA has a high-gain and a low pass characteristic in frequency. The high gain is necessary for obtaining a precise regulation. The low-pass characteristic is necessary for comparing and then regulating signals only in the frequency range of interest e.g. a sinusoidal content of the PWM output signal OUTP (meaning its average value), with the a sinusoidal input signal In. By low-pass filtering, relatively high frequency components of the power PWM signal OUTP, are attenuated. The feedback loop is connected to power PWM output signal OUTP and not to OUT, which is a filtered replica of the output signal OUTP. Indeed, a connection to OUT would add two poles determined by L,C filter in the open-loop. The saw-tooth signal Vchop is not mandatory anymore. Systems as described U.S. Pat. No. 5,949,282 or U.S. Pat. No. 6,320,460 have a self-switching behavior. Only in non-regulated systems as described in FIG. 11, the saw-tooth form of signal was compulsory for making the comparator switching. But the saw-tooth can be kept anyway as in U.S. Pat. No. 6,346,852 for feedback-loop class D amplifiers.

A further improvement of class D amplifiers is three state class D amplifier. This type of circuit is based on a PWM pattern signal as described in U.S. Pat. No. 6,211,728. The main feature of this amplifier is that the output signal is no longer a PWM signal having two states low and high, but now has three states i.e. low, high and idle. The idea is further developed in U.S. Pat. No. 6,262,632. The amplifier has a fully differential structure as shown in FIG. 13. The amplifier comprises two substantially identical parts each part comprising the same blocks identified by the same name, with and without accents. The circuit also comprises a saw-tooth generator (STG) providing a saw-tooth signal Vchop and a substantially in anti phase signal/Vchop. If the two power output PUP and PDW are either both equal to 0 or both equal to Vp, then the differential power signal (PUP-PDW) is 0 i.e. there is no injection of current in the load. A first advantage of the three state class D amplifier in comparison with the normal ones is that in case of idle mode i.e. in audio range this means that no sound is transmitted, a normal class D amplifier would permanently output a PWM signal with a duty cycle exactly equal to 50%, that is averaged to 0 after L,C filtering. But switching up and down the output with this duty cycle of 50% still consumes a current through the power switches SW1, SW2' or SW1, SW2' leading to a power dissipation in the switches and in the loudspeaker. In case of three state amplifiers, in idle mode, the differential output (PUP-PDW) signal is directly set in this idle-mode value: there is no averaging of high currents, and so no consumption through the power switches.

Another advantage of the three state class D amplifier is that in idle mode, there are only some short peaks of currents at the output and therefore a LC filter is no longer necessary, the signal being filtered by the load e.g. a loudspeaker. As a direct consequence, there is no need for a LC filter that occupies a significant area on Printed Circuit Board (PCB). When PCB area is critical e.g. PCBs used in phone-handsets, this is a major advantage compared to the other class D amplifiers. The amplifier described in U.S. Pat. No. 6,262,632 has several drawbacks. It uses a one-pole low-pass filter that limits the gain and, consequently, the accuracy of regulation. A single pole low-pass filtering determines a 20 dB/decade attenuation. If the switching frequency of the STG is 500 kHz, and the magnitude of the output signal is 1V, then it results still 100 mV-ripple at 50 kHz i.e. one decade lower after filtering of this fed back output, and still around 50 mV at 20 kHz. This 50 mV signal introduces a noise in the regulation accuracy. The switching frequency may be increased for example from 500 kHz to 2 MHz, but it increases the internal power consumption.

Another disadvantage is the crossover distortion. In idle mode, there is no switching at all of the power output. The same appears in case of a sinusoid that crosses the Vcom voltage, Vcom being a reference voltage situated substantially at Vpp/2. The gain is reduced, resulting in increasing crossover distortion, because there is no loop-regulation. The lack of regulation also induces crosstalk distortions as it is mentioned in U.S. Pat. No. 6,262,632. This problem is corrected using a short time delay, but this delay requires additional circuitry i.e. asynchronous delay or use of a high frequency counter.

It is therefore an object of present applications to reduce crossover distortions in a three state class D amplifier. The invention is defined in independent claims. The dependent claims define advantageously embodiments. Reducing crossover distortions is achieved in a device as described in the first paragraph, wherein the comparing means are coupled to a threshold generator coupled to the first and second input signals and to first and second reference signals representing an estimation of a maximum and a minimum signal value through the load and generating an alternating threshold signal that is inverse proportional to a difference between the first and second input signals for maintaining a relative high gain of the amplifier in an idle state. In the idle state the amplifier still maintains relatively short low/high pulses whose average value is 0. In state of the art three state class D amplifiers relatively short pulses that are either all up, or all down and therefore, non-symmetric are generated. Generating the alternating threshold signal with respect Vcom in the idle state solves the problem. The input signal in the threshold generator is compared with a maximum predicted value for the signal and when the signal is around Vcom the threshold signal has a value different than zero.

In an embodiment of the invention threshold signal is inverse proportional to an integral of a difference between the first and second input signals for maintaining a relative high gain of the amplifier in an idle state. In order to improve the amplifier performances with temperature and process technology spread the alternating threshold signal previously described is replaced by its integral. Integration is usually done using resistors and capacitors. Using the same type of components as used in the other blocks of the amplifier ensures an increased immunity to technology process and temperature.

In another embodiment of the invention the threshold generator comprises a first subtractor and a second subtractor coupled to a multiplexer, the first subtractor providing a signal proportional with a difference between the first input signal and the minimum estimated signal, the second subtractor providing a signal proportional with a difference between the second input signal and the maximum estimated signal, the multiplexer providing the threshold signal. If the input voltage is relatively large, the difference with the maximum expected value is low. The threshold signal provided by the multiplexer is alternated around the virtual ground level with a low magnitude. The Plus/Minus alternating effect is made with the multiplexer that selects either the difference (Vp−Vmax) or (Vn−Vmin). Because each of these signals is symmetric with respect to virtual ground signal Vcom, the final multiplexed signal is alternated with Vcom as a central, average value.

The threshold generator comprises, voltage to current converter means for converting a voltage difference between first and second input signals and respective first and second reference signals into a current. The threshold generator further comprises a first integrator and second integrator coupled to the voltage to current converter means for generating the threshold signal via a multiplexing means.

The voltage to current transformation of the input signal is necessary because the current are relatively easy to be integrated using capacitors and, subsequently, capacitors are relatively easy to be integrated using actual technologies. The multiplexing means are used for alternating the threshold voltage below and above Vcom by selecting either first integrator output signal or second integrator output signal. The multiplexing means may comprise a series coupling of sample and hold means coupled to an analog multiplexer for generating the threshold signal. If by accident a slope of the threshold signal is substantially identical to a slope of the low-pass filtered signals or even more, if the threshold signal is substantially equal with the low-pass filtered signals, then a meta-stability problem occurs. In order to avoid this situation the signals provided by the first and second integrators are first memorized using a sample and hold circuit and after that they are multiplexed. The low-pass filtered signals have always a given slope. So if the threshold signal varies with constant steps, it is guaranteed that the low-pass filtered signals cross the threshold signal without sticking to this voltage.

In another embodiment of the invention each of the first and the second low-pass filter means comprises a first low-pass filter for low-passing a signal representing the difference between the respective first and second input signals and a first and second output signals provided at the first and second ends of the load and generating a first signal. The first signal is inputted to an input of a third subtracting means and to a second low-pass filter. The second low-pass filter provides a second signal to a further input of the subtracting means. The subtracting means generates the low-pass filtered signal. The first and the second low-pass filter comprise a first and second differential input amplifier having a respective input coupled to a reference signal being substantially equal to half of a supply voltage. As it was previously mentioned, a higher order low pass filtering is necessary in order to filter high frequency components from the useful signal. Hence, a higher order low-pass filter is necessary. Increasing the order of the filter may create stability problems in the amplifier introducing additional phase-shifts. Using the above-mentioned solution, a zero is introduced in the transfer function of the filter and therefore the stability problems are avoided. Furthermore, in order to obtain symmetrical output signals the signals are centered with respect a virtual ground.

An important application of the amplifier according to the invention is an audio integrated amplifier whose load is a loudspeaker. Furthermore, because of its efficiency the amplifier may be used in portable devices as CD players, mobile phones and receivers.

The above and other features and advantages of the invention will be apparent from the following description of the exemplary embodiments of the invention with reference to the accompanying drawings, in which.

Figure 3:
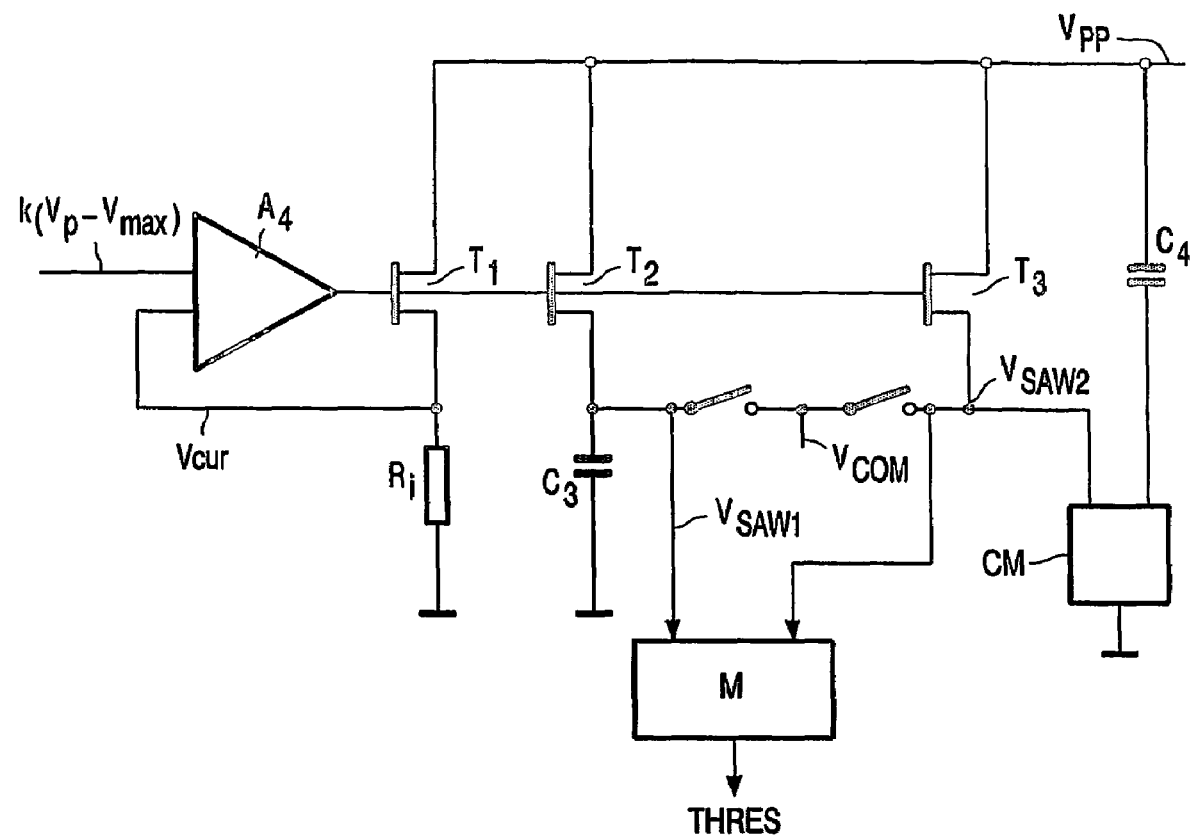
Figure 4:
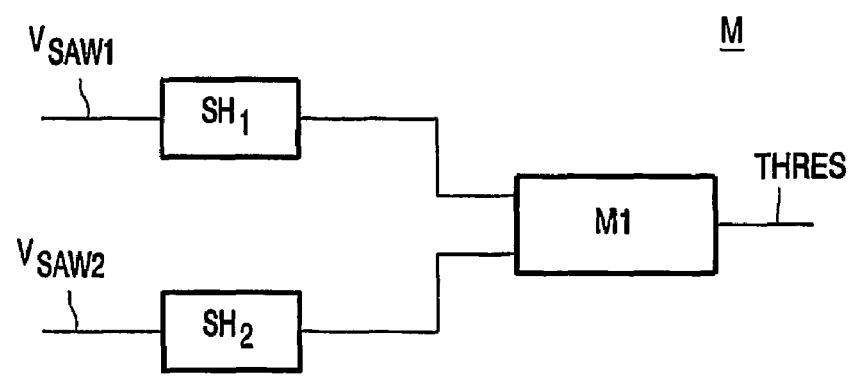
Figure 5:
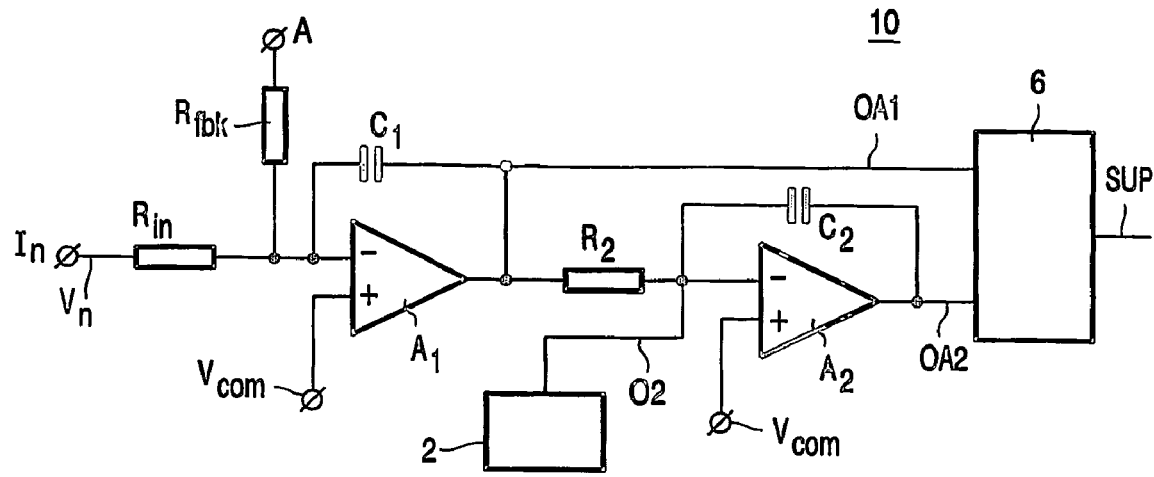
Figure 6:
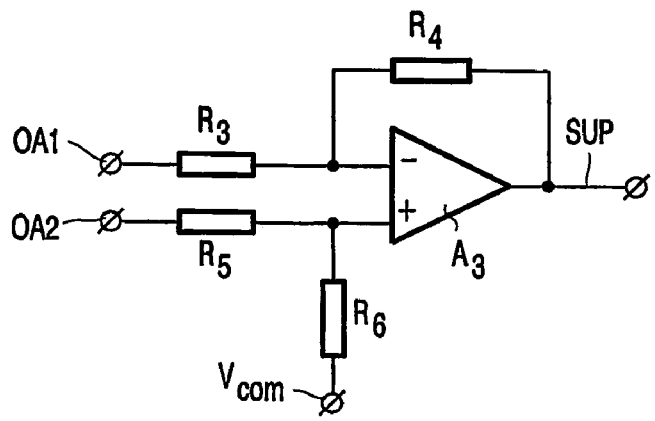
Figure 7:
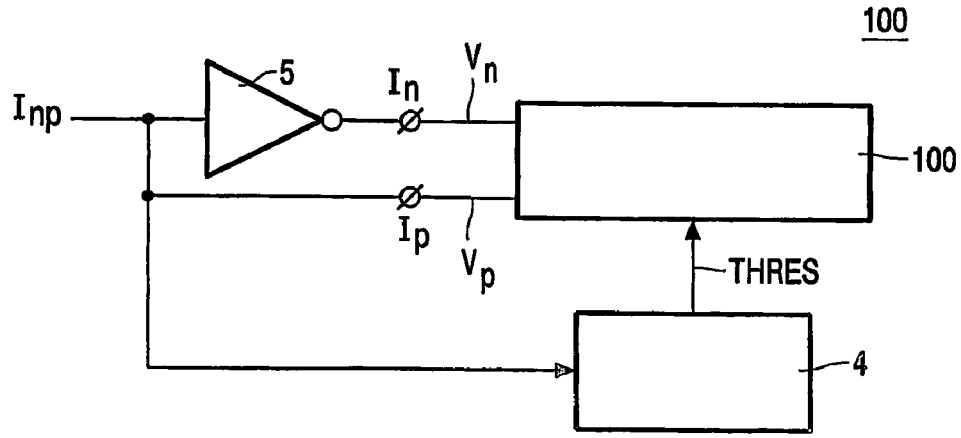
Figure 8:
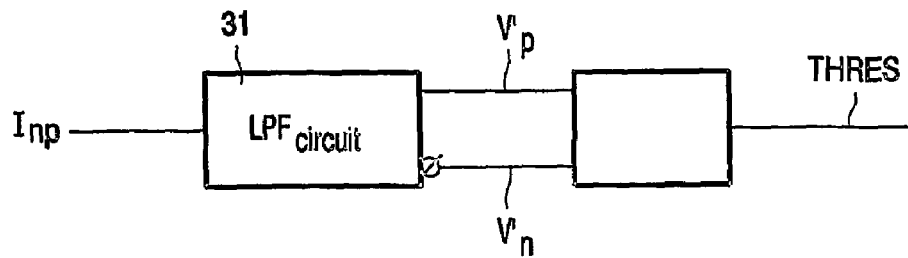
Figure 9:
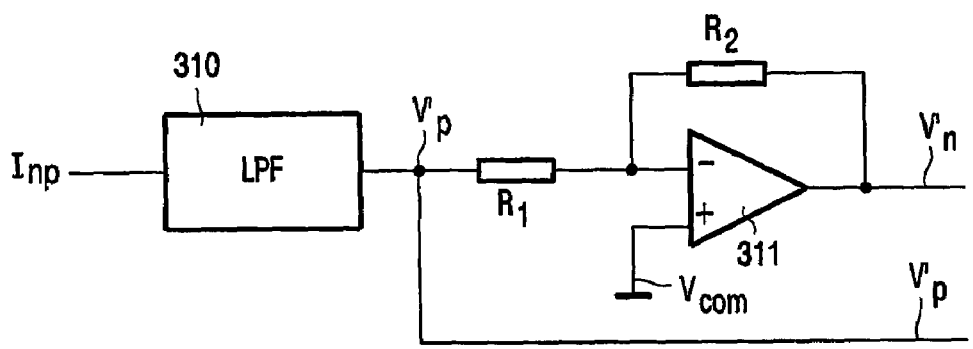
Figure 10:
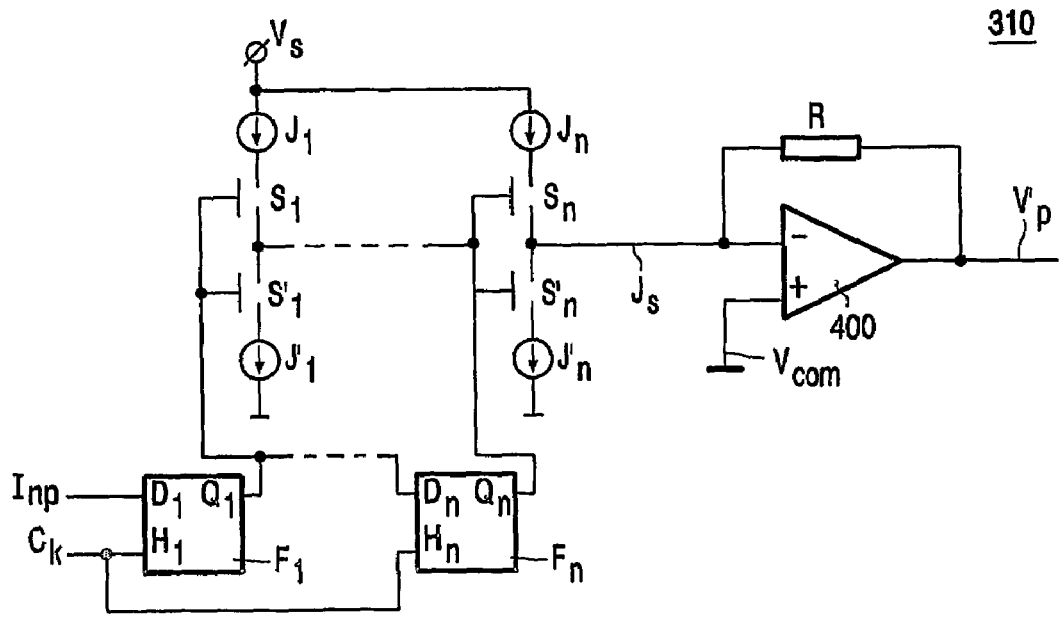
Figure 11:
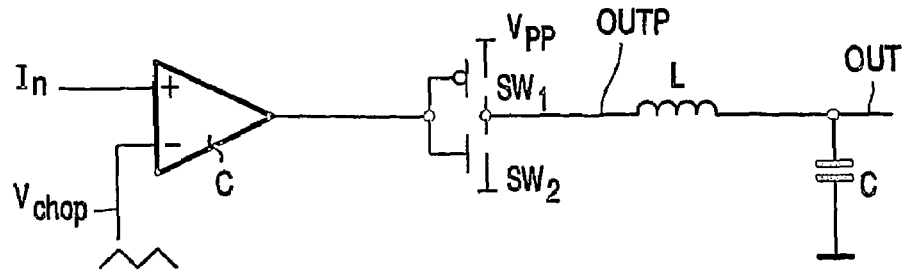
Figure 12:
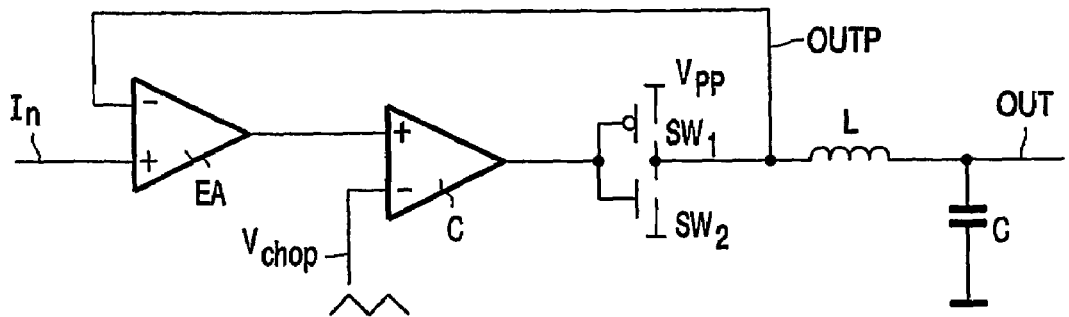
Figure 13:
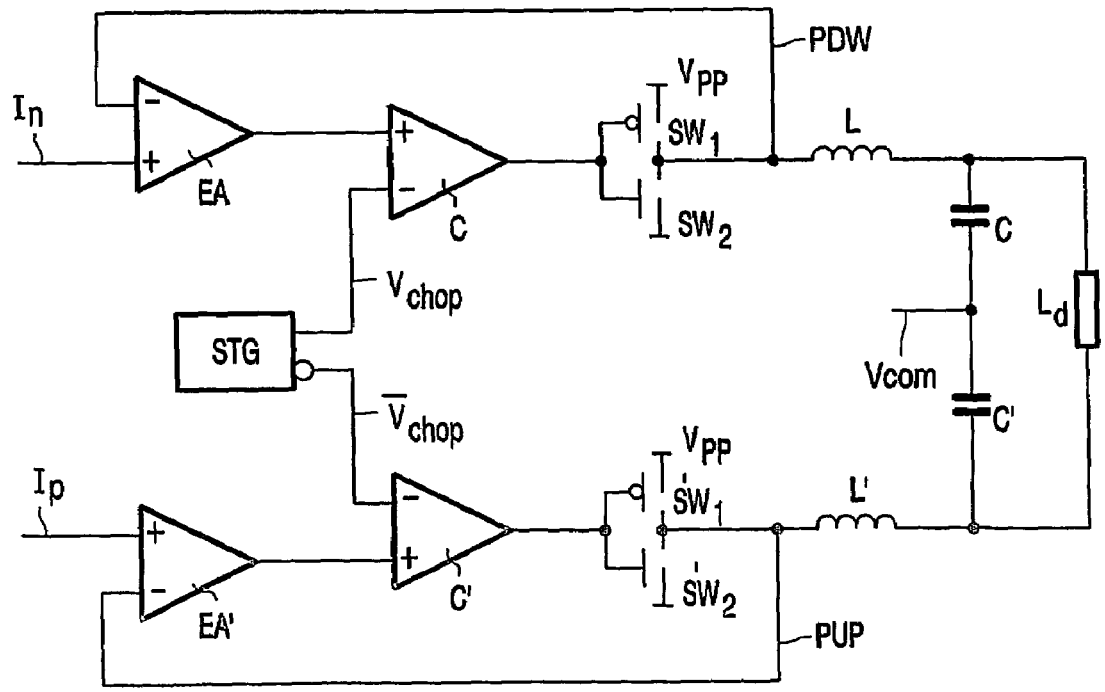

FIG. 3 depicts a more detailed implementation of the threshold signal generator, according to the invention, FIG. 4 depicts a further detailed implementation of the threshold signal generator, FIG. 5 depicts an embodiment of low-pass filtering means, according to the invention, FIG. 6 depicts a subtractor, according to the invention, FIG. 7 depicts a class D amplifier having a common input signal as a stream of binary signals, FIG. 8 depicts a more detailed implementation of a threshold detector with a stream of binary signals as input, FIG. 9 depicts an embodiment of the further low-pass filter means, FIG. 10 depicts an implementation of the third low-pass filter, FIG. 11 depicts a prior art class D amplifier, FIG. 12 depicts another prior art class D amplifier, and FIG. 13 depicts a prior art three state class D amplifier.

Figure 1:
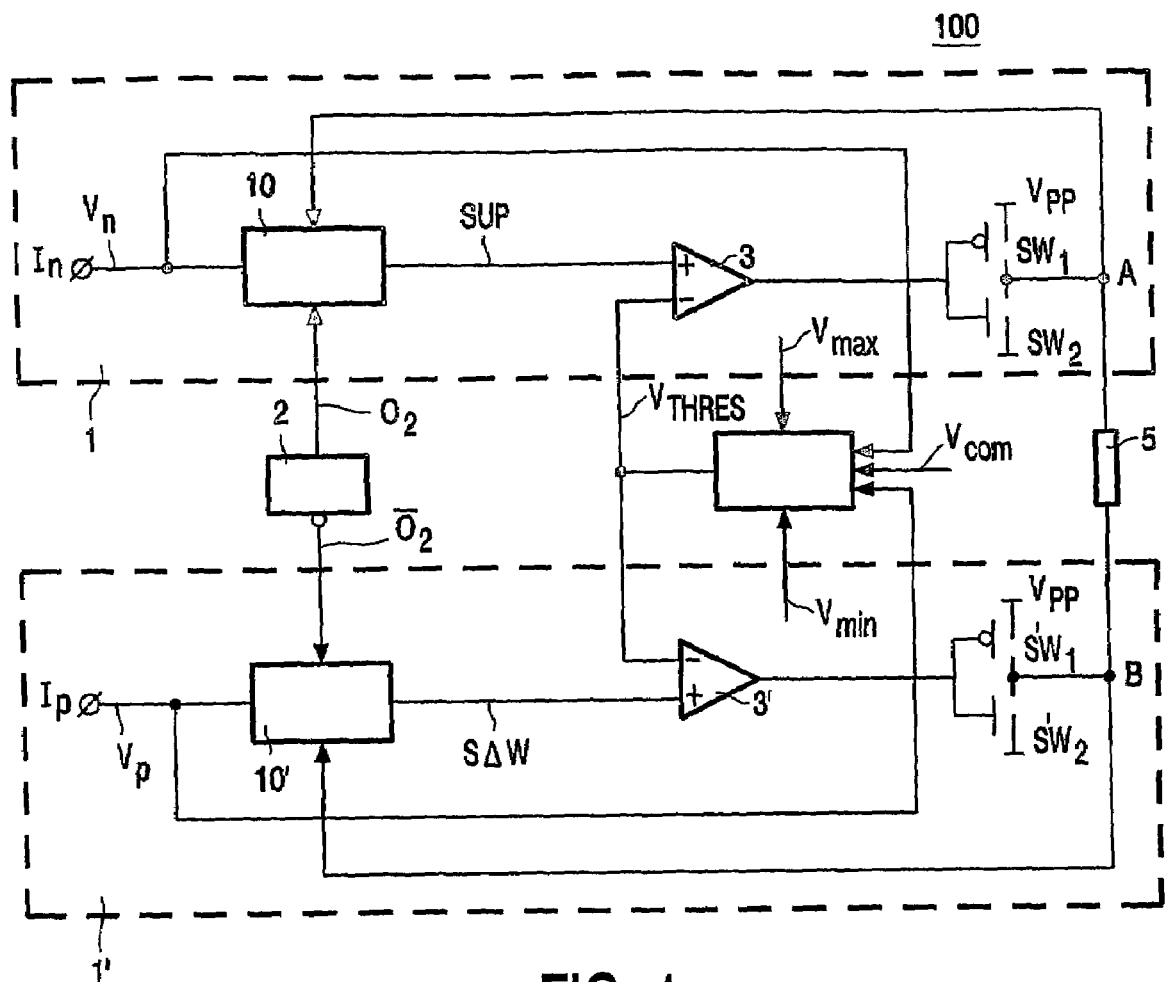
FIG. 1 depicts a three state class D amplifier, according to the invention.

FIG. 1 depicts a three state class D amplifier, according to the invention. The three state class D amplifier 100 comprises a first signal path 1 and a second signal path 1' substantially identical with the first signal path 1. The first and second signal paths 1, 1' are coupled to respective first and second ends A, B of a load 5 and to respective first and second input signals Vn, Vp provided by input circuitry, in this embodiment being just two input node In, Ip. Each of the signal paths 1, 1' comprises respective first and second low-pass filters 10, 10' coupled to respective input signals Vn, Vp, first and second ends A, B of the load 5 and to a pulse generator 2. The signal generator 2 provides a signal having a frequency substantially higher than a frequency of the input signals Vn, Vp for generating respective first and second low-pass filtered signals SUP, SDW. The low-pass filtered signals SUP, SDW are inputted to respective comparators 3, 3'. The comparators 3, 3' are coupled to a threshold generator 4 coupled to the first and second input signals Vn, Vp and to first and second reference signals Vmax, Vmin representing an estimation of a maximum and a minimum signal value through the load 5 and generating an alternating threshold signal THRES that is proportional to a difference between the first and second input signals Vn, Vp for maintaining a relative high gain of the amplifier in an idle state. In the idle state the amplifier still maintains relatively short low/high pulses whose average value is 0. In state of the art three state class D amplifiers output signals are symmetric with respect a virtual ground voltage Vcom and the comparison is made with respect virtual ground Vcom. In idle mode the output signal of the amplifier at first and second ends of the load is zero. This may determine a common mode voltage to be grounded. Generating the alternating threshold signal THRES with respect Vcom in the idle state solves the problem. The input signal in the threshold generator 4 is compared with a maximum predicted value for the signal Vmax and when the signal is around Vcom the threshold signal THRES has a value different than zero.

Normally, low-pass filters 10, 10' are implemented using RC filters, a time constant of the filter means 10, 10' being proportional with the RC product. A problem that is encountered when RC filters are integrated is that the RC time/gain constants vary with the temperature and with the process spread. Therefore, the signals SUP and SDW have a spread in their magnitudes. If the magnitude of SUP and SDW become too low, they can be larger than VTHRES and therefore, there will be no switching of the signals generated by comparators 3, 3'. It results a drop of the gain and increase of distortion. This problem is solved by replacing VTHRES by its integral. This integration is achieved by converting the previous VTHRES signal into a current with the same type of resistors as used in all the other parts of the circuit. This current is injected into the same type of capacitor as used in all the low-pass integrators. In this way, if for example all the resistances decrease, then SUP and SDW increase, but VTHRES also increases.

Figure 2:
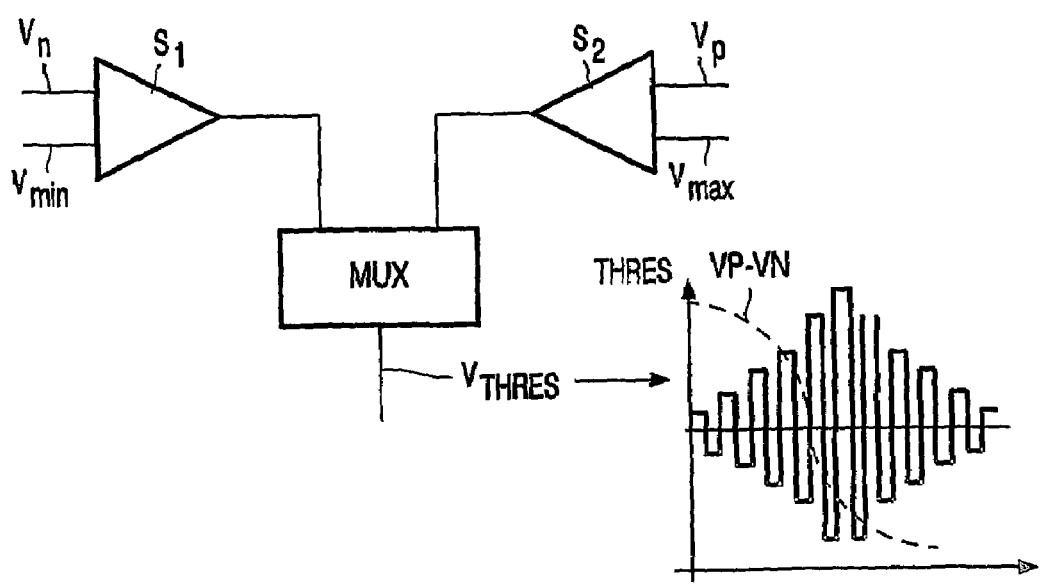
FIG. 2 depicts a threshold signal generator, according to the invention.

FIG. 2 depicts a threshold signal generator 4, for use in a preferred embodiment of the invention. The threshold generator 4 comprises a first subtractor S1 and a second subtractor S2 coupled to a multiplexer MUX, the first subtractor S1 providing a signal proportional with a difference between the first input signal Vn and the minimum estimated signal Vmin. The second subtractor S2 provides a signal proportional with a difference between the second input signal Vp and the maximum estimated signal Vmax, the multiplexer MUX providing the threshold signal THRES. The subtractors S1, S2 may be implemented as shown in FIG. 6. In FIG. 6, OA1 and OA2 are the input signals in the subtractor. Usually, R3=R5 and R4=R6 and the output signal is proportional with OA2-OA1 with a constant k=R4/R3. Coming back to FIG. 2, the signal VTHRES is also implemented by subtracting the input voltage from a maximum and a minimum expected signals Vmax and Vmin, respectively. Hence, if the input voltage is relatively large, the difference with the maximum expected value Vmax is low, and THRES has a low magnitude. The signal VTHRES will be alternated around VCOM with a low magnitude. The Plus/Minus alternating effect is made with a multiplexer MUX that selects either the difference (Vp−Vmax) or (Vn−Vmin). Because each of these signals is symmetric with respect to virtual ground signal Vcom, the final multiplexed signal is alternated with Vcom as a central, average value as shown in the graphical representation of the behavior of the threshold signal as a function of Vp−Vn.

FIG. 3 depicts a more detailed implementation of the threshold signal generator 4. For simplicity is shown only a half of the threshold generator 4, the other half being substantially identic to the first half excepting the signals involved. The threshold signal generator comprises voltage to current converter means A4, T1, Ri for converting a voltage difference Vcur between second input signal Vp and second reference signals Vmax into a current. The threshold generator 4 further comprises a first integrator T2, C3 and a second integrator T3, C4 biased by a current mirror CM, first and second integrators being coupled to the voltage to current converter means A4, T1, Ri for generating the threshold signal THRES via a multiplexing means M. As previously shown, a voltage proportional to the difference between the input signal Vp and its maximal expected magnitude is Vmax is generated. Then a resistance Ri generates a current. The current is used to generate two sawtooth signals VSAW1 and VSAW2, substantially in anti-phase i.e. when one increases the other decreases, respectively. On a phase of a clock signal ck1, VSAW1 is maintained to the common mode voltage Vcom and VSAW2, that was on the previous phase stuck to Vcom, starts to ramp down, proportionally with k(Vp−Vmax)/(Ri*C). On a second phase of a the ck2, VSAW1 ramps up and VSAW2 is maintained to Vcom. Thus, the chopping functionality is also reproduced to ensure that the power output voltage is centered around VCOM. The resistor Ri and the capacitors C1=C2 values are fitted such that the chopped saw-tooth signal magnitude always exceeds the magnitude of the signals SUP and SDW.

FIG. 4 depicts a further detailed implementation of the threshold signal generator 4, wherein the multiplexing means M comprises a series coupling of sample and hold means SH1, SH2 coupled to an analog multiplexer M1 for generating the threshold signal THRES. If by accident a slope of the threshold signal is substantially identical to a slope of the low-pass filtered signals or even more, if the threshold signal is substantially equal with the low-pass filtered signals, then a meta-stability problem occurs. In order to avoid this situation the signals provided by the first and second integrators are first memorized using a sample and hold circuit and after that they are multiplexed.

FIG. 5 depicts an embodiment of low-pass filters 10, 10', for use in a preferred embodiment of the invention. Each of the first and the second low-pass filters 10, 10' comprise a first low-pass filter A1, Rin, Ffbk, C1 for low-passing a signal representing the difference between the respective first and second input signals Vn, Vp and a first and second output signals provided at the first and second ends A, B of the load 5 and generating a first signal OA1. The first signal OA1 is inputted to an input of a fifth subtractor 6 and to a second low-pass filter A2, R2, C2. The second low-pass filter A2, R2, C2 provides a second signal OA2 to a further input of the fifth subtracting means 6. The fifth subtractor 6 generates the low-pass filtered signal SUP. The first low-pass filter A1, Rin, Ffbk, C1 and the second low-pass filter A2, R2, C2 comprise a first and second differential input amplifier A1, A2 having a respective input coupled to a reference signal Vcom being substantially equal to half of a supply voltage Vpp. The overall low-pass filter has an attenuation of 40 dB/decade, improving prior-art amplifiers performance. For simplicity in FIG. 5 only the first low-pass filter 10 is shown, the second low-pass filter 10' being substantially identical to the first one, excepting signals. An output signal from the first end A of the load 5, which may be a loudspeaker, is fed back through feedback resistor Rfbk and compared with input Vn. The difference A/Rfbk−Vn/Rin in fully differential mode is equivalent to the subtraction B/Rfbk−Vp/Rin. The result of the subtraction is a current difference, which is integrated by the capacitor C1. The resulting low-pass filtered signal is OA1. A second integrator R2, C2, A2 performs a second low-pass filtering of the signal OA1 and generates an output signal OA2. A two-pole system was obtained. In order to avoid stability problems i.e. to obtain phase-shifts larger than e.g. 60 degrees the subtractor 6 is provided. In this way, in the transfer function of the low-pass filtering means is introduced a zero in the left half-plane of the complex plane for improving the overall phase-shift to 90 degrees approximately. The circuit, as shown in FIG. 5, must ensure that the subtractors 3, 3' always switch regularly for properly control the output. This is achieved by adding a differential sawtooth, triangular signal to the signals generated by the second low-pass filter R2, C2, A2. A common way to add this signal is to apply a squared-pulse current O2 on the input of the second integrator generated by an pulse generator 2. This current charges and discharges the capacitor C2 and results the addition of a triangular sawtooth to the signal OA2. The subtractor 6 may be implemented as shown in FIG. 6 and described previously.

FIG. 7 depicts a class D amplifier having a common input signal Input as a stream of binary signals. The class D amplifier comprises an inverter 5 coupled to the common input signal Input. The inverter 5 generates a mutually in antiphase stream of binary signals Vn, which are inputted to the amplifier 100. The input stream of binary signals Input is also inputted to the threshold generator 4. The threshold generator 4 comprises a further low-pass filter means 31 coupled to the common input signal Input and generating the first input signal Vp and the second input signal Vn. The further low-pass filter means 31 is used for averaging the bitstream signal Input. In order to generate the first and the second input signals Vn, Vp the further low-pass filter means 31 comprises a third low-pass filter 310 generating the first input signal Vn, the low-pass filter 310 being coupled to an inverting amplifier means 311 generating the second input signal Vp, as shown in FIG. 9. In the embodiment shown in FIG. 9 the inverting amplifier means 311 comprises an inverting repeater implemented using an operational amplifier having an inverting input "−" and a non-inverting input "+" coupled to the reference signal Vcom. The signal generated by the further low-pass filter Vp is inverted i.e. substantially 180 degrees phase shifted and the first input signal Vn is generated at the output of the further low-pass filter. Resistors R1 and R2 are used for controlling an amplitude of the first signal Vn such that to be substantially equal to the second input signal Vp. As a further low-pass filter 31, a Finite Impulse Response (FIR) filter as shown in FIG. 10 may be used. The common input signal Input is inputted in a shift register comprising a cascaded connected string of flip-flops F1, . . . , Fn. The flip-flops are controlled by a clock signal Ck, which determines a delay through each flip-flop. Each flip-flop output Q1, . . . , Qn is coupled to a respective switchable current sources (J1, J'1), . . . , (Jn, J'n) via respective switches (S1, S'1), . . . ,(Sn, . . . , S'n). An output current Js of the switchable current sources is coupled to a current to voltage converter 400 generating the second input signal Vp.

The three state class D amplifier as described in present application may be integrated in a single audio frequency chip as a class D power amplifier. Furthermore, because it has relatively reduced power consumption and a relatively high efficiency it may be used in portable devices as receivers, CD and/or DVD players, etc.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A three state class D amplifier (100) comprising
    a first signal path (1) and a second signal path (1') substantially identical with the first signal path (1),
    each of the signal paths (1, 1') comprising respective first and second low-pass filter means (10, 10') coupled to respective input signals (Vn, Vp) provided by input means (Inp, In, Ip), first and second ends (A, B) of a load (5) and to an pulse generator (2) providing a signal having a frequency substantially higher than a frequency of the input signals (Vn, Vp) for generating respective first and second low-pass filtered signals (SUP, SDW),
    said low-pass filtered signals (SUP, SDW) being inputted to respective comparing means (3, 3'), and
    the comparing means (3, 3') being coupled to a threshold generator (4) coupled to the input means (Inp, In, Ip) and to first and second reference signals (Vmax, Vmin) representing an estimation of a maximum and a minimum signal value through the load (5) and generating an alternating threshold signal (THRES) that is inverse proportional to a difference between the first and second input signals (Vn, Vp) for maintaining a relative high gain of the amplifier in an idle state.

2. A three state class D amplifier (100) as claimed in claim 1, wherein the first and the second signals (Vn, Vp) are mutually in antiphase and are coupled to the first signal path (1) and to the second signal path (1').

3. A three state class D amplifier (100) as claimed in claim 2, wherein the threshold signal (THRES) is inverse proportional to an integral of a difference between the first and second input signals (Vn, Vp) for maintaining a relative high gain of the amplifier in an idle state.

4. A three state class D amplifier (100) as claimed in claim 2, wherein the threshold generator (4) comprises a first subtractor (S1) and a second subtractor (S2) coupled to a multiplexer (MUX), the first subtractor (S1) providing a signal proportional with a difference between the first input signal (Vn) and the minimum estimated signal Vmin, the second subtractor (S2) providing a signal proportional with a difference between the second input signal (Vp) and the maximum estimated signal (Vmax), the multiplexer (M) providing the threshold signal (THRES).

5. A three state class D amplifier (100) as claimed in claim 3, wherein the threshold generator (6) comprises, voltage to current converter means (A4, T1, Ri) for converting a voltage difference (Vcur) between first and second input signals (Vn, Vp) and respective first and second reference signals (Vmax, Vmin) into a current.

6. A three state class D amplifier (100) as claimed in claim 5, wherein threshold generator (4) further comprises a first integrator (T2, C3) and second integrator (T3, C4) biased by a current mirror (CM), said integrators being coupled to the voltage to current converter means (A4, T1, Ri) for generating the threshold signal (THRES) via a multiplexing means (M).

7. A three state class D amplifier (100) as claimed in claim 6, wherein the multiplexing means (M) comprises a series coupling of sample and hold means (SH1, SH2) coupled to an analog multiplexer (M1) for generating the threshold signal (THRES).

8. A three state class D amplifier (100) as claimed in claim 1, wherein each of the first and the second low-pass filter means (10, 10') comprises
    a first low-pass filter (A1, Rin, Ffbk, C1) for low-passing a signal representing the difference between the respective first and second input signals (Vn, Vp) and a first and second output signals provided at the first and second ends (A, B) of the load (5) and generating a first signal (OA1),
    the first signal (OA1) being inputted to an input of a subtracting means (6) and to a second low-pass filter (A2, R2, C2),
    the second low-pass filter (A2, R2, C2) providing a second signal (OA2) to a further input of the subtracting means (6),
    the subtracting means (6) generating the low-pass filtered signal (SUP).

9. A three state class D amplifier (100) as claimed in claim 3, wherein the first and the second low-pass filter comprises a first and second differential input amplifier (A1, A2) having a respective input coupled to a reference signal (Vcom) being substantially equal to half of a supply voltage (Vpp).

10. A three state class D amplifier as claimed in claim 1, said input means comprising an inverter means (5) for inverting a common input signal (Inp), being a stream of binary signals.

11. A three state class D amplifier as claimed in claim 10, wherein the input means comprises a further low-pass filter means (31) coupled to the common input signal (Inp) and generating further first input signal (V'n) and a further second input signal (V'p).

12. A three state class D amplifier as claimed in claim (11), wherein the further low-pass filter means (31) comprises a third low-pass filter (310) generating the further first input signal (V'n), the low-pass filter (310) being coupled to an inverting amplifier means (311) generating the further second input signal (V'p).

13. An audio frequency amplifier comprising a three state class D amplifier (100) as claimed in claim 1.

14. A portable electronic device as a mobile phone, CD player, radio receiver comprising a three state class D amplifier (100) as claimed in claim 1.

* * * * *